(12) United States Patent
Daigle et al.

(10) Patent No.: US 9,294,080 B2
(45) Date of Patent: Mar. 22, 2016

(54) REVERSE CURRENT BLOCKING COMPARATOR

(71) Applicant: Fairchild Semiconductor Corporation, San Jose, CA (US)

(72) Inventors: Tyler Daigle, Portland, ME (US); Julie Lynn Stultz, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 132 days.

(21) Appl. No.: 14/228,614

(22) Filed: Mar. 28, 2014

(65) Prior Publication Data
US 2014/0323184 A1 Oct. 30, 2014

Related U.S. Application Data

(60) Provisional application No. 61/816,279, filed on Apr. 26, 2013.

(51) Int. Cl.
*H03K 17/56* (2006.01)
*H03K 17/06* (2006.01)
*H02J 7/00* (2006.01)

(52) U.S. Cl.
CPC ............. *H03K 17/063* (2013.01); *H02J 7/0029* (2013.01); *H03K 2217/0018* (2013.01); *H03K 2217/0054* (2013.01)

(58) Field of Classification Search
CPC ............................ H03K 17/063; H03K 17/56
USPC ........... 327/50, 365, 419, 423–427, 434, 437, 327/534, 574, 581
See application file for complete search history.

(56) References Cited

U.S. PATENT DOCUMENTS 5,608,344 A * 3/1997 Marlow ........................ 327/206
8,947,156 B2 * 2/2015 Stultz et al. .................... 327/534

* cited by examiner

*Primary Examiner* — William Hernandez
(74) *Attorney, Agent, or Firm* — Schwegman Lundberg & Woessner, P.A.

(57) ABSTRACT

An apparatus comprises at least one transistor configured as analog switch, a well biasing circuit configured to provide a dynamic electrical bias to a bulk region of the at least one transistor, and a comparator circuit in electrical communication with the well biasing circuit and the transistor. The comparator circuit is configured to detect a first operating condition of the transistor and a second operating condition of the transistor. The well biasing circuit is configured to apply a first electrical bias to the bulk region of a transistor when the first operating condition is detected and apply a second electrical bias to the bulk region of the transistor when the second operating condition is detected, and wherein the comparator is configured to apply hysteresis to detection of the first and second operating conditions.

20 Claims, 5 Drawing Sheets

US 9,294,080 B2

REVERSE CURRENT BLOCKING COMPARATOR

CLAIM OF PRIORITY

This application claims the benefit of priority under 35 U.S.C. §119(e) of Daigle et al., U.S. Provisional Patent Application Ser. No. 61/816,279, filed on Apr. 26, 2013, the benefit of priority of which is claimed hereby, and is incorporated by reference herein in its entirety.

BACKGROUND

Electronic circuits and systems often include electronic switches. An electronic switch can be used to transmit an analog signal to a circuit path or to prevent an analog signal from being sent to a circuit path. Such a switch is sometimes referred to as an analog switch or a pass switch to differentiate this type of switch from a digital switch which changes its output state in response to an input, but does not pass a received signal. An analog switch that is able to function properly for different types of analog signals can be useful in many electronic systems.

OVERVIEW

This document relates generally to electronic switches and methods of their operation. An apparatus example includes at least one transistor configured as analog switch, a well biasing circuit configured to provide a dynamic electrical bias to a bulk region of the at least one transistor, and a comparator circuit in electrical communication with the well biasing circuit and the transistor. The comparator circuit is configured to detect a first operating condition of the transistor and a second operating condition of the transistor. The well biasing circuit is configured to apply a first electrical bias to the bulk region of a transistor when the first operating condition is detected and apply a second electrical bias to the bulk region of the transistor when the second operating condition is detected, and wherein the comparator is configured to apply hysteresis to detection of the first and second operating conditions.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This document relates generally to electronic switches. More specifically this document relates to optimizing the performance of analog switches of integrated circuits (ICs). Analog switches include transistors and the performance of analog switches can be affected by biasing of a transistor body. A transistor body refers to a bulk, well, or substrate that contains the transistor. For a p-type metal oxide semiconductor (PMOS) transistor, the bulk of the transistor (e.g., an n-type well that may be contained in a p-type substrate or a direct connection to an n-type substrate) is usually connected to the most positive supply voltage available to the circuit. For an n-type metal oxide semiconductor (NMOS) transistor, the bulk of the transistor (e.g., a p-type well contained in an n-type well within a p-type substrate, a p-type well contained within an n-type substrate, or a direct connection to a p-type substrate) is usually connected to the most negative power supply available or to ground.

However, in some applications an analog switch circuit may be exposed to an under-voltage condition. For instance, it may be possible for the voltage at an output of a switch NMOS transistor to decrease below the voltage of the lowest supply. The biasing of the bulk of the transistor should also be able to go negative to avoid forward biasing a bulk to source p-n junction. Additionally, transistors can be susceptible to a body effect in which the threshold voltage ($V_T$) of a transistor can change due to a difference in voltage between the transistor source and the transistor body. To reduce the body effect, transistor bodies can be connected to the source of the transistor, but this can degrade the performance of the transistor as an analog switch circuit. To improve performance, a transistor biasing network can be used to change the biasing of transistors to adapt to changes in voltages applied to the transistors.

Figure 1:
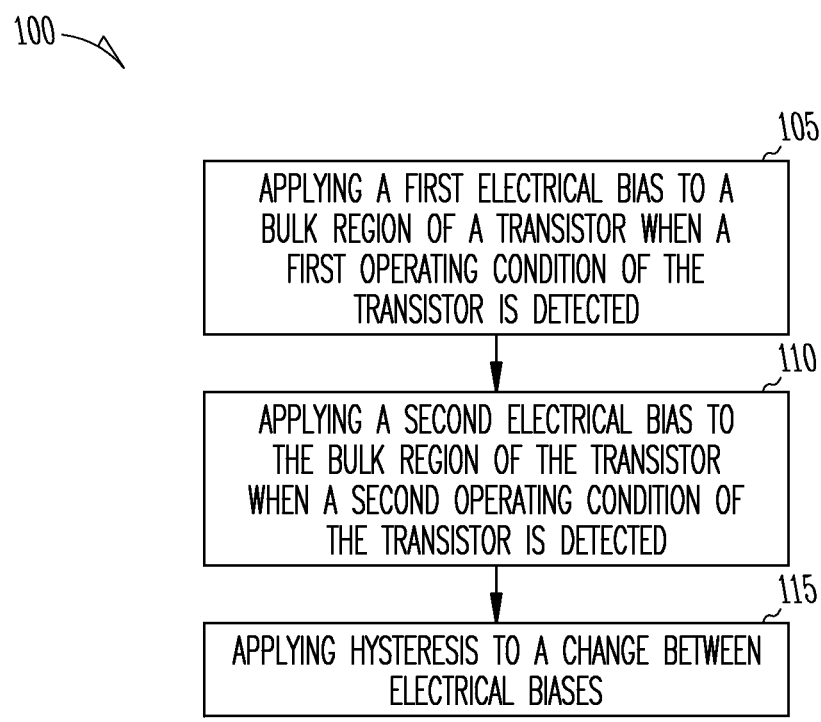
FIG. 1 shows a flow diagram of an example of a method to operate an analog switch circuit.

FIG. 1 shows a flow diagram of an example of a method 100 to operate an analog switch circuit of an IC. To reduce the body effect, body biasing of a transistor of the switch circuit is changed based on operating conditions of the transistor. The operating conditions can change according to electrical signals present at the transistor. At block 105 of the method, a first electrical bias is applied to a bulk region of a transistor when a first operating condition is detected. If the transistor is an NMOS transistor, the bulk region may be in included in a p-type well or a p-type substrate. If the transistor is a PMOS transistor, the bulk region may be in included in an n-type well or an n-type substrate.

At block 110, a second electrical bias is applied to the bulk region of the transistor when a second operating condition of the transistor is detected. The bulk region of the transistor may be surrounded by other wells, or the analog switch may include both NMOS and PMOS transistors that include multiple wells. Dynamic electrical biasing may be provided to multiple wells and the substrate, and the electrical biasing may be adjusted according to detected operating conditions.

The operating conditions of the transistor (or transistors) may be defined by the voltages applied to the transistor. The first operating condition may include a voltage at an input to the transistor (e.g., at a first source/drain region of the transistor) being greater than a voltage at an output of the transistor (e.g., at the second source/drain region of the transistor), and the second operating condition may include the voltage at the input of the transistor being less than the voltage at the output of the transistor. In certain examples, the electrical biasing prevents a diode drop from a supply voltage of the IC to the bias voltage applied to the transistor bulk. A diode drop can occur when the input voltage is close to the value of the output voltage of the transistor (e.g., when the difference between the input voltage and the output voltage is less than the threshold voltage of the transistor).

At block 115, hysteresis is applied to a change in the electrical biasing. This includes applying hysteresis to a change from the first electrical bias to the second electrical bias when the second operating condition is detected and applying hysteresis to a change from the second electrical bias to the first electrical bias when the first operating condition is detected. Applying hysteresis may reduce noise from switching electrical bias of one or both of the wells and substrate when the input voltage and output voltage are close in value.

Figure 2:
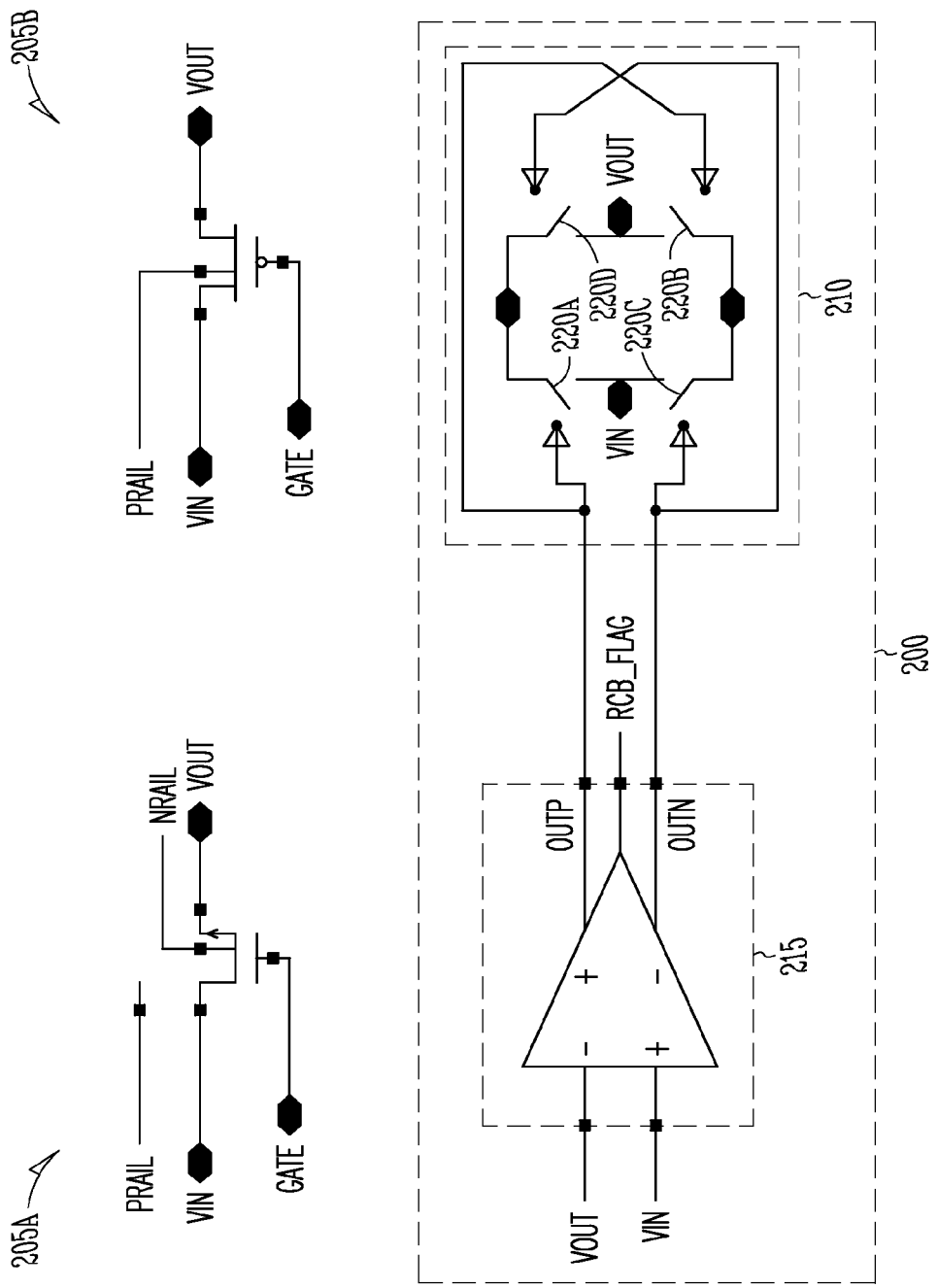
FIG. 2 shows a block diagram of an example of portions of a device to optimize performance of an analog switch circuit.

FIG. 2 shows a block diagram of an example of portions of a device 200 to optimize performance of an analog switch circuit. The Figure shows two examples where the analog switch circuit includes a pass transistor or pass gate. When a pass transistor is activated by a control signal received at the gate connection, the pass transistor passes a signal received at the input (vin) to the output (vout). The first example includes an NMOS transistor 205A as the pass transistor and the second example shows a PMOS transistor 205B as the pass transistor. The analog switch circuit can include both an NMOS transistor and a PMOS transistor connected in parallel as a complimentary MOS (CMOS) transistor pair.

The NMOS transistor 205A shows connections Prail and Nrail. Prail refers to a more positive bias rail and represents an electrical connection to an n-type well or n-type substrate. Nrail represents a bias rail connection to a p-type well or p-type substrate. The bulk region of the NMOS transistor 205A is connected to Nrail. The PMOS transistor 205B shows the bulk region connected to Prail.

The device 200 is typically formed on the same IC as the analog switch circuit and includes a well biasing circuit 210 and a comparator circuit 215. The well biasing circuit 210 and the comparator circuit 215 can be included in a biasing network. The well biasing circuit 210 provides a dynamic electrical bias to a bulk region of a transistor or transistors of the IC. The comparator circuit 215 is in electrical communication with the well biasing circuit 210 and the transistor 205A, 205B.

In some examples, the device 200 and the analog switch circuit are included in a battery charging system. The device 200 can be used to generate logic signals used to control circuits that provide functions such as removing a battery from a circuit. In certain examples, the device 200 and analog circuit are included in an electronic battery-protection system of a cellular phone (e.g., the input can be a voltage from a wall charger). In certain examples, the device 200 and analog switch circuit are included in an electronic battery-charging system, such as a battery-charging system connectable to a universal serial bus (USB) port.

The input of the analog switch circuit (vin) can be electrically connected to a power supply and activation of the pass transistor applies the power supply to the output of the analog switch circuit (vout). When the pass transistor is deactivated or disabled, the output of the analog switch may be allowed to float or may be pulled to ground. The output could also be pulled negative (e.g., below ground) if desired. It may be desirable to operate the battery charging system symmetrically in case vin and vout become reversed. Thus, either side of the pass transistor could be the power source, and therefore, the highest voltage in the system. Although the example is described in relation to a battery charging system, the methods and devices can be useful for any analog switch application where the switch input and the switch output can be interchangeable.

The comparator circuit 215 may detect a first operating condition of a transistor and detect a second operating condition of the transistor. In some examples, the first operating condition is the voltage at the input of the transistor (vin) being greater than the voltage at the output of the transistor (vout). The detection of the first operating condition may be indicated by the positive comparator output (OutP) activating. In some examples, the second operating condition includes the voltage at the input being less than the voltage at the output. The detection of the first operating condition may be indicated by the negative comparator output (OutN) activating.

The well biasing circuit 210 may apply a first electrical bias to the bulk of the transistor 205A, 205B when the first operating condition is detected. The first electrical bias can include reducing the bias (Nrail) of a p-type well of the transistor by a difference between the voltage at the input of the transistor and the voltage at the output of the transistor. As shown in the Example of FIG. 2, the well biasing circuit 210 may have an H-bridge circuit topology. To apply the electrical bias, the well biasing circuit 210 may activate switches 220A, 220B. If vin is great than vout, the voltage of Prail will be made to be greater than Nrail by the difference between vin and vout.

The well biasing circuit 210 may apply a second electrical bias to the bulk of the transistor 205A, 205B when the second operating condition is detected. The second electrical bias can include increasing the bias (Prail) of an n-type well of the transistor by the difference between the voltage at the output of the transistor and the voltage at the input of the transistor when the second operating condition is detected. In the example of FIG. 2, the well biasing circuit 210 may activate switches 220C, 220D to apply the second electrical bias.

Figure 3A:
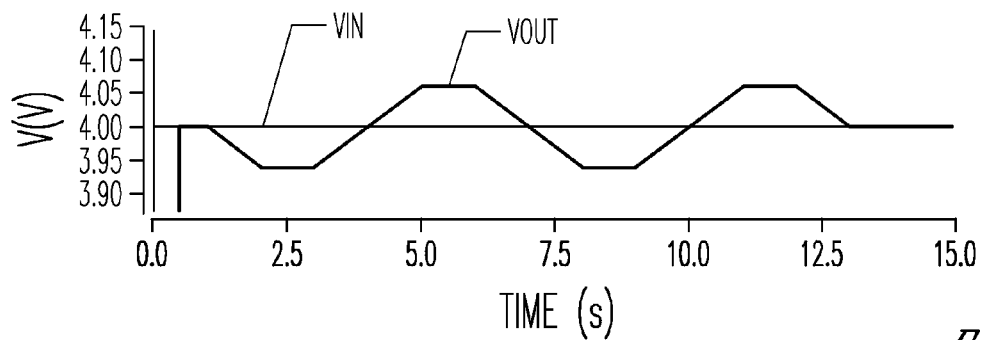
FIGS. 3A-3D show an example of a simulation of optimizing performance of an analog switch circuit.
Figure 3B:
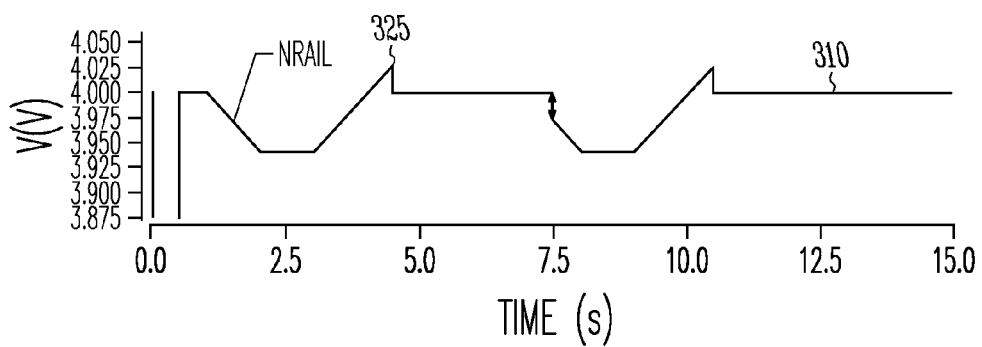
Figure 3C:
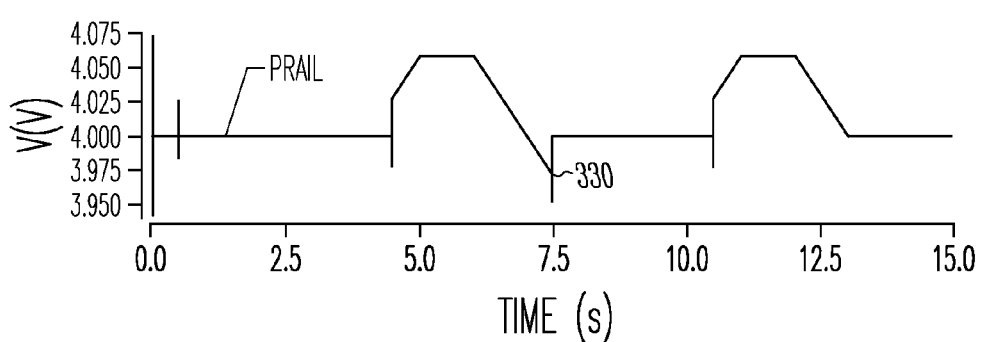

FIGS. 3A-3D show an example of a simulation of operating the device 200 to optimize performance of the analog switch circuit. FIG. 3A shows the inputs to the comparator circuit 215 vin and vout. The input voltage vin is held constant at four volts (4.0V) while the output voltage vout is varied. The waveform 310 in FIG. 3B shows that Nrail is reduced by the difference between vin and vout for the operating condition of vout less than vin. The waveform in FIG. 3C shows that Prail remains at 4.0V when vout is less than vin. FIG. 3C also shows that Prail is increased by the difference between vout and vin for the operating condition of vout greater than vin, while the waveform in FIG. 3B shows that Nrail is held to 4.0V for this operating condition. The simulation shows that the device 200 properly detects operating conditions when the difference between the input voltage and the output voltage is less than the threshold voltage of the transistor (e.g., 25 millivolts as shown in the example). In certain examples, the device 200 properly detects operating conditions when the difference between the input voltage and the output voltage is as low as one millivolt (1 mV).

Figure 3D:
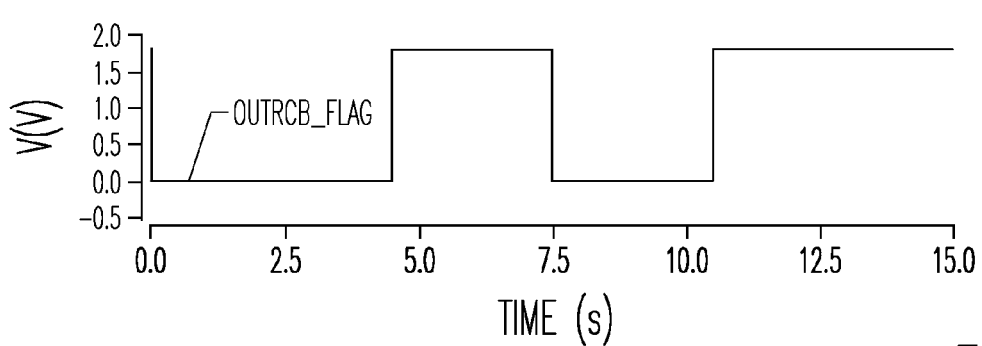

According to some examples, the comparator circuit 215 provides an indication of the operating condition of the analog switch circuit. FIG. 3D shows the OutRCB_flag output of the comparator circuit 215 in FIG. 2. In the example of FIGS. 3A-3D, the OutRCB_flag output is high to indicate when vout is greater than vin (the second operating condition), and low to indicate when vout is less than vin (the first operating condition). The indication of the operating condition can be used to alter operation of the analog switch. For instance, the device may include a control circuit (not shown). For the battery charging system example, if the comparator circuit 215 indicates detection of vout of the analog switch circuit being greater than vin, this indication may mean that the input and output are reversed and the indication can be provided to the control circuit and used to disable the analog switch circuit.

The simulation of FIGS. 3A-3D also shows that the comparator circuit 215 applies hysteresis to the detection of the first and second operating conditions. For instance, when in the first operating condition of vin>vout, the waveform in FIG. 3B shows at 325 that the comparator circuit 215 does not indicate the second operating condition of vout>vin until vout is greater than vin by 25 mV. When in the second operating condition of vout>vin, the waveform in FIG. 3C shows at 330 that the comparator circuit 215 does not indicate the first operating condition of vin>vout until vin is greater than vout by 25 mV. Thus, the hysteresis applied by the comparator circuit 215 is symmetrical for the change when the second operating condition is detected and for the change when the first operating condition is detected.

Figure 4:
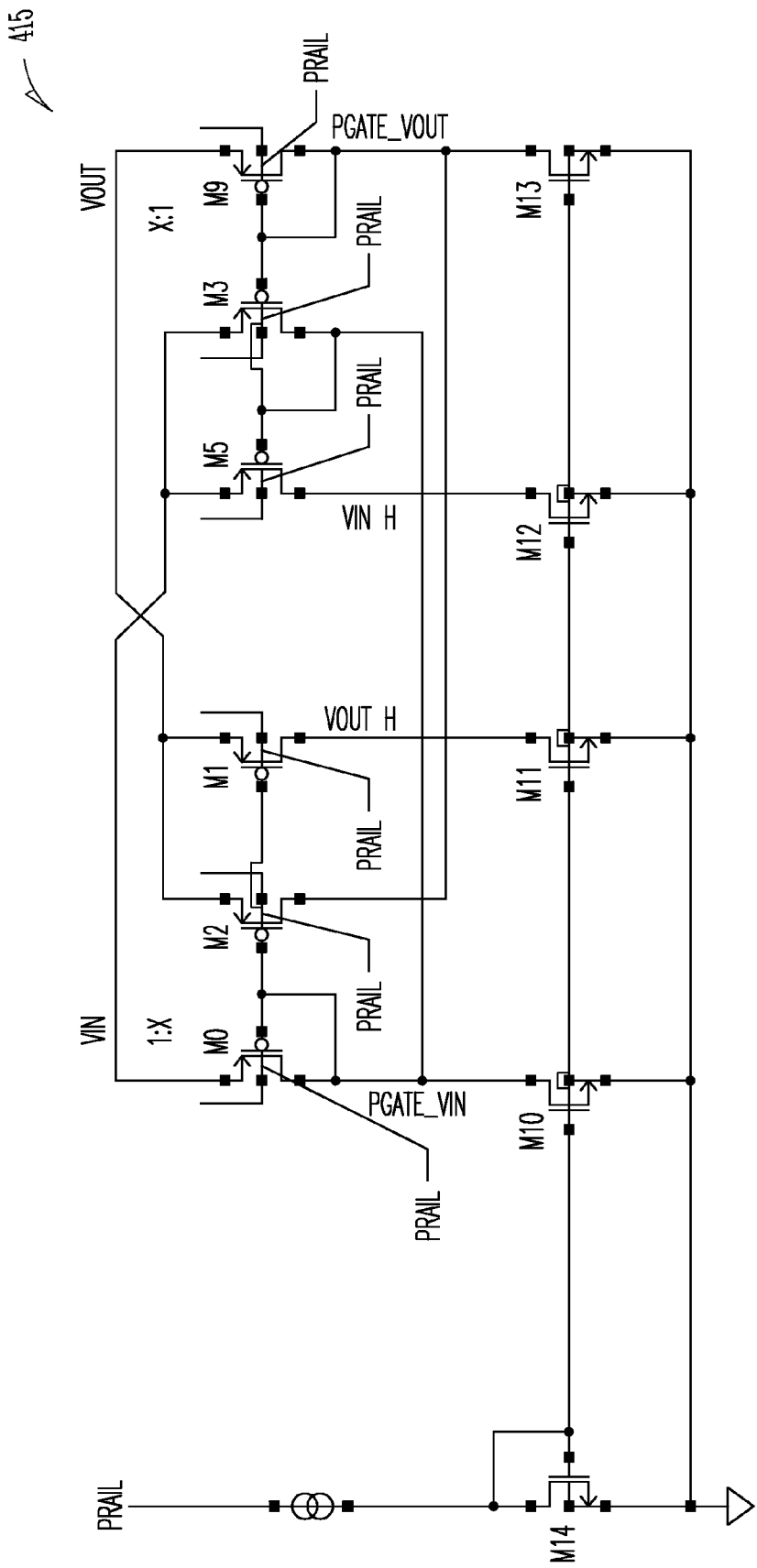
FIG. 4 shows a schematic of an example of a comparator circuit.

FIG. 4 shows a schematic of an example of a comparator circuit 415. The comparator circuit 415 has a differential input. The differential input is located at the sources of transistors M0 and M9 and is labeled vin and vout. The outputs of the comparator are located at the drains of transistors M1 and M5 and are labeled voutH and voutL. Only one of the outputs voutH and voutL is active at any time.

The comparator circuit 415 includes cross coupled devices. Symmetrical hysteresis of switching of the outputs of the comparator circuit 415 is provided by the cross coupling of transistors M2 and M3. In some examples, the hysteresis point is adjustable. The cross coupled devices M2 and M3 are shown attached to current mirrors. A current reference Iref is provided to the current mirrors. The hysteresis point of the comparator circuit 415 can be adjusted by changing Iref, or by changing a ratio of the devices of the current mirrors. In certain examples, devices in a current mirror can be selectively activated or deactivated to change the ratio of the current and change the hysteresis point. The hysteresis point can also be changed by changing the ratio (shown as X to 1) of devices M2 to M0 and devices M3 to M9.

Figure 5:
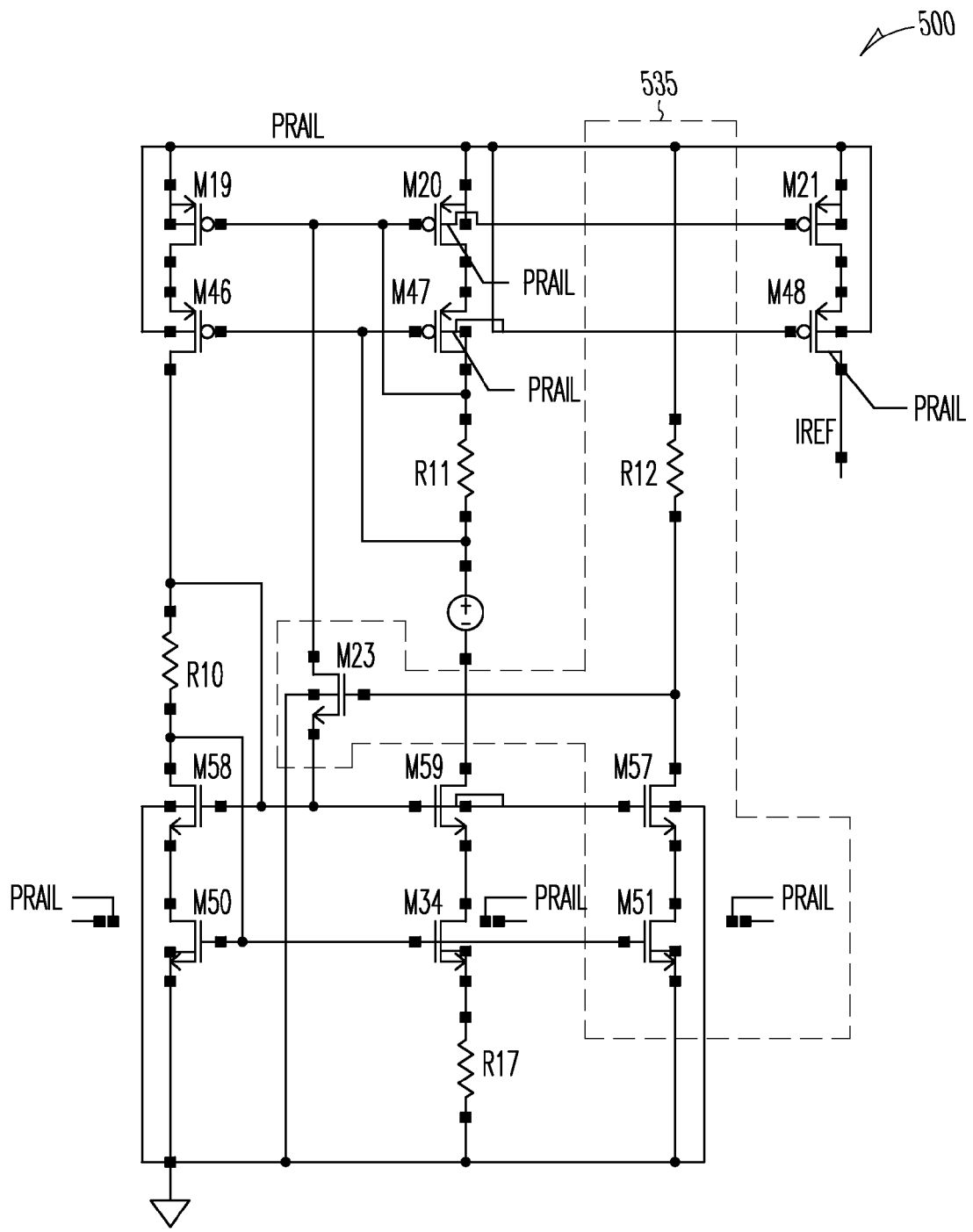
FIG. 5 shows a schematic of an example of a current biasing circuit that generates a current reference.

FIG. 5 shows a schematic of an example of a current biasing circuit 500 that generates a current reference Iref for the comparator. The current biasing circuit 500 can include a start-up circuit 535. The start-up circuit 535 provides a current reference Iref that is always on when a voltage is present at Prail. Thus for the device of FIG. 2, if the load transistor 205A, 205B, the well biasing circuit 210, the comparator circuit 215 and the current reference are included in an IC, the current reference is active upon application of a non-zero voltage to the to a p-type well of the IC. In some examples, the current biasing circuit 500 provides constant tranconductance (gm) current biasing. The constant gm current biasing allows the hysteresis level of the comparator to track the drain-source on-resistance (Rdson) of the transistor of the analog switch circuit.

As explained previously herein, the comparator circuit 215 can provide an indication of the operating condition of the analog switch circuit. For instance, the OutRCB_flag output in FIG. 2 can be high to indicate when vout is greater than vin (the second operating condition), and low to indicate when vout is less than vin (the first operating condition). Thus, the output of the comparator circuit 215 can indicate a direction of current through the transistor 205A, 205B. If the direction of current is from the output of the transistor to the input of the transistor, the comparator circuit output can be used to indicate an overcurrent condition. If the hysteresis level or trip point of the comparator circuit 215 tracks Rdson, the trip point provides a consistent over-current indication when the OutRCB_flag output is activated.

In some examples, the OutRCB_flag output can be used to indicate the amount of current passing through the analog switch circuit. For instance, if Rdson of the load transistor 205A, 205B is known and the voltage trip point of the comparator circuit is known, a change at the OutRCB_flag output can indicate the magnitude of the current through the load transistor from Rdson, the trip point voltage, and Ohm's law. The device 200 can be useful standalone without the analog switch circuit. In this arrangement, the comparator 215 and the well biasing circuit 210 can be used as an active full wave rectifier.

The methods and devices described herein can improve the performance of analog switch circuits. Forward biasing of p-n junctions is avoided using dynamic biasing of device wells. The dynamic biasing can also allow the activation connection (e.g., a gate connection) to be pulled to the supply rail to prevent leakage in an off-state of the switch. The body effect of transistors in the analog switch is minimized which can improve switch on-resistance. Over current detection can also be provided.

Additional Notes and Examples

Example 1 can include subject matter (such as an apparatus) comprising at least one transistor configured as an analog switch, a well biasing circuit configured to provide a dynamic electrical bias to a bulk region of the at least one transistor, and a comparator circuit in electrical communication with the well biasing circuit and the transistor. The comparator circuit is configured to detect a first operating condition of the transistor and a second operating condition of the transistor. The well biasing circuit is configured to apply a first electrical bias to the bulk region of a transistor when the first operating condition is detected and apply a second electrical bias to the bulk region of the transistor when the second operating condition is detected, and wherein the comparator is configured to apply hysteresis to detection of the first and second operating conditions.

In Example 2, the subject matter of Example 1 can optionally include a first operating condition that includes a voltage at an input of the transistor being greater than a voltage at an output of the transistor, and a second operating condition that includes the voltage at the input of the transistor being less than the voltage at the output of the transistor.

In Example 3, the subject matter of one or any combination of Examples 1 and 2 can optionally include a well biasing circuit configured to reduce the bias of a p-type well of the transistor by a difference between the voltage at the input of the transistor and the voltage at the output of the transistor when the first operating condition is detected, and configured to increase the bias of an n-type well of the transistor by the difference between the voltage at the output of the transistor and the voltage at the input of the transistor when the second operating condition is detected.

In Example 4, the subject matter of one or any combination of Examples 1-3 can optionally include a comparator circuit is configured to apply adjustable hysteresis to detection of the first and second operating conditions.

In Example 5, the subject matter of Example 4 can optionally include a plurality of cross coupled devices attached to current mirrors, and wherein the hysteresis is adjustable by changing a ratio of devices of the current mirrors.

In Example 6, the subject matter of Example 5 can optionally include a current reference for the current mirrors, wherein the at least one transistor, the well biasing circuit, the comparator circuit and the current reference are included in an IC, and wherein the current reference is active upon application of a non-zero voltage to an n-type well of the IC.

In Example 7, the subject matter of one or any combination of Examples 1-6 optionally includes a transistor included in an analog switch circuit, and the comparator circuit includes an output configured to indicate an operating condition of the analog switch.

In Example 8, the subject matter of Example 7 optionally includes a control circuit configured to alter operation of the analog switch circuit according to the output of the comparator.

In Example 9, the subject matter of Examples 7 and 8 optionally includes an output of to comparator circuit that indicates at least one of a direction of current through the transistor or a magnitude of the current through the transistor.

In Example 10, the subject matter of one or any combination of Examples 1-9 optionally includes a transistor included in a pass gate circuit.

In Example 11, the subject matter of one or any combination of Examples 1-10 optionally includes the at least one transistor, the well biasing circuit, and the comparator circuit included in a battery charging system.

In Example 12, the subject matter of one or any combination of Examples 1-11 optionally includes the at least one transistor, the well biasing circuit, and the comparator circuit included in a battery charging system configured to provide charge to a battery for a cellular phone.

In Example 13, the subject matter of one or any combination of Examples 1-12 optionally includes a comparator circuit configured to detect, as the first operating condition of the transistor, a voltage at an input to the transistor being greater than a voltage at an output of the transistor by less than a threshold voltage of the transistor, and configured to detect, as the second operating condition, the voltage at the output of the transistor being greater than the voltage at the input of the transistor by less than the threshold voltage of the transistor.

Example 14 can include subject matter (such as a method, a means for performing acts, or a machine readable medium including instructions that, when performed by the machine, that can cause the machine to perform acts), or can optionally be combined with the subject matter of one or any combination of Examples 1-13 to include subject matter, comprising applying a first electrical bias to a bulk region of a transistor when a first operating condition of the transistor is detected and applying a second electrical bias to the bulk region of the transistor when a second operating condition of the transistor is detected. The transistor is can be configured as an analog switch. Changing between the first electrical bias and the second electrical bias can include applying hysteresis to a change from the first electrical bias to the second electrical bias when the second operating condition is detected and applying hysteresis to a change from the second electrical bias to the first electrical bias when the first operating condition is detected In Example 15, the subject matter of Example 14 can optionally include applying the first electrical bias to the transistor of an analog switch circuit when detecting that a voltage at an input of the analog switch is greater than a voltage at an output of the analog switch, and applying the second electrical bias to the transistor of the analog switch circuit when detecting that the voltage at the input of the analog switch is less than a voltage at the output of the analog switch.

In Example 16, the subject matter of one or any combination of Examples 14 and 15 optionally includes reducing the bias of a p-type well of the transistor by a difference between the voltage at the input of the transistor and the voltage at the output of the transistor, and increasing the bias of an n-type well of the transistor by the difference between the voltage at the output of the transistor and the voltage at the input of the transistor when the second operating condition is detected.

In Example 17, the subject matter of one or any combination of Examples 14-16 optionally includes applying hysteresis that is symmetrical for the change when the second operating condition is detected and for the change when the first operating condition is detected.

In Example 18, the subject matter of one or any combination of Examples 14-18 optionally includes indicating an operating condition of the transistor, and altering operation of an analog switch circuit that includes the transistor according to the indicated operating condition.

In Example 19, the subject matter of one or any combination of Examples 14-18 optionally includes indicating a direction of current through the transistor.

In Example 20, the subject matter of one or any combination of Examples 14-19 optionally includes indicating a magnitude of current through the transistor.

Example 21 can include, or can optionally be combined with any portion or combination of any portions of any one or more of Examples 1-20 to include, subject matter that can include means for performing any one or more of the functions of Examples 1-20, or a machine-readable medium including instructions that, when performed by a machine, cause the machine to perform any one or more of the functions of Examples 1-20.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
   at least one transistor configured as an analog switch;
   a well biasing circuit configured to provide a dynamic electrical bias to a bulk region of the at least one transistor; and
   a comparator circuit in electrical communication with the well biasing circuit and the transistor, wherein the comparator circuit is configured to detect a first operating condition of the transistor and a second operating condition of the transistor,
   wherein the well biasing circuit is configured to apply a first electrical bias to the bulk region of the transistor when the first operating condition is detected and apply a second electrical bias to the bulk region of the transistor when the second operating condition is detected, and wherein the comparator is configured to apply hysteresis to detection of the first and second operating conditions.

2. The apparatus of claim 1, wherein the first operating condition includes a voltage at an input of the transistor being greater than a voltage at an output of the transistor and the second operating condition includes the voltage at the input of the transistor being less than the voltage at the output of the transistor.

3. The apparatus of claim 1, wherein the well biasing circuit is configured to reduce the bias of a p-type well of the transistor by a difference between the voltage at the input of the transistor and the voltage at the output of the transistor when the first operating condition is detected, and to increase the bias of an n-type well of the transistor by the difference between the voltage at the output of the transistor and the voltage at the input of the transistor when the second operating condition is detected.

4. The apparatus of claim 1, wherein the comparator circuit is configured to apply adjustable hysteresis to detection of the first and second operating conditions.

5. The apparatus of claim 4, wherein the comparator includes a plurality of cross coupled devices attached to current mirrors, and wherein the hysteresis is adjustable by changing a ratio of sizes of transistors used in the current mirrors.

6. The apparatus of claim 5, including a current reference for the current mirrors, wherein the at least one transistor, the well biasing circuit, the comparator circuit and the current reference are included in an IC, and wherein the current reference is active upon application of a non-zero voltage to an n-type well of the IC.

7. The apparatus of claim 1, wherein the transistor is included in an analog switch circuit and the comparator circuit includes an output configured to indicate an operating condition of the analog switch.

8. The apparatus of claim 7, including a control circuit configured to alter operation of the analog switch circuit according to the output of the comparator.

9. The apparatus of claim 7, wherein the output of the comparator circuit indicates at least one of a direction of current through the transistor or a magnitude of the current through the transistor.

10. The apparatus of claim 1, wherein the transistor is included in a pass gate circuit.

11. The apparatus of claim 1, wherein the at least one transistor, the well biasing circuit, and the comparator circuit are included in a battery charging system.

12. The apparatus of claim 11, wherein the battery-charging system is configured to provide charge to a battery for a cellular phone.

13. The apparatus of claim 1, wherein the comparator circuit is configured to detect, as the first operating condition of the transistor, a voltage at an input to the transistor being greater than a voltage at an output of the transistor by less than a threshold voltage of the transistor, and to detect, as the second operating condition, the voltage at the output of the transistor being greater than the voltage at the input of the transistor by less than the threshold voltage of the transistor.

14. A method comprising:
    applying a first electrical bias to a bulk region of a transistor when a first operating condition of the transistor is detected, wherein the transistor is configured as an analog switch; and
    applying a second electrical bias to the bulk region of the transistor when a second operating condition of the transistor is detected, wherein changing between the first electrical bias and the second electrical bias includes applying hysteresis to a change from the first electrical bias to the second electrical bias when the second operating condition is detected and applying hysteresis to a change from the second electrical bias to the first electrical bias when the first operating condition is detected.

15. The method of claim 14, wherein applying a first electrical bias to a bulk region of a transistor includes applying the first electrical bias to the transistor of an analog switch circuit when detecting that a voltage at an input of the analog switch is greater than a voltage at an output of the analog switch, and wherein applying a second electrical bias to the bulk region of a transistor includes applying the second electrical bias to the transistor of the analog switch circuit when detecting that the voltage at the input of the analog switch is less than the voltage at the output of the analog switch.

16. The method of claim 14, wherein applying a first electrical bias to a bulk region of a transistor includes reducing the bias of a p-type well of the transistor by a difference between a voltage at the input of the transistor and the voltage at the output of the transistor, and wherein applying a second electrical bias to a bulk region of the transistor includes increasing the bias of an n-type well of the transistor by the difference between the voltage at the output of the transistor and the voltage at the input of the transistor when the second operating condition is detected.

17. The method of claim 14, wherein applying hysteresis includes applying hysteresis that is symmetrical for the change when the second operating condition is detected and for the change when the first operating condition is detected.

18. The method of claim 14, including indicating an operating condition of the transistor, and altering operation of an analog switch circuit that includes the transistor according to the indicated operating condition.

19. The method of claim 18, wherein indicating the operation of the transistor includes indicating a direction of current through the transistor.

20. The method of claim 18, wherein indicating the operation of the transistor includes indicating a magnitude of current through the transistor.

* * * * *